United States Patent [19]

Compton

[11] 3,999,087
[45] Dec. 21, 1976

[54] MISSING PHASE DETECTION CIRCUIT FOR USE WITH THREE-PHASE POWER SOURCES

[75] Inventor: John R. Compton, Riviera Beach, Md.

[73] Assignee: Westinghouse Electric Corporation, Pittsburgh, Pa.

[22] Filed: Aug. 15, 1975

[21] Appl. No.: 605,139

[52] U.S. Cl. .............................. 307/295; 307/232; 307/273; 307/311; 317/47; 307/218
[51] Int. Cl.² ........................................ H03K 5/20
[58] Field of Search .......... 307/216, 218, 273, 295, 307/296, 311, 232; 317/47

[56] References Cited

UNITED STATES PATENTS

| | | | |
|---|---|---|---|
| 3,431,467 | 3/1969 | Calfee | 317/47 |
| 3,469,196 | 9/1969 | Cowin et al. | 307/295 |
| 3,575,637 | 4/1971 | Krieger et al. | 317/47 X |
| 3,778,638 | 12/1973 | Garratt | 307/295 X |
| 3,783,354 | 1/1974 | Fletcher et al. | 317/47 X |

*Primary Examiner*—John S. Heyman
*Attorney, Agent, or Firm*—D. Schron

[57] ABSTRACT

A circuit for detection of a missing phase voltage condition, and certain other malfunction conditions, in the output of a three-phase A.C. alternator or power supply. Three pulse forming circuits are provided with their input ends each connected to receive a different one of the phase voltages. Each pulse forming circuit provides an output pulse signal for a duration corresponding to the excursion of its corresponding phase signal in a predetermined one of the voltage polarities of the power supply. The outputs of the pulse forming circuits are connected to individual inputs of an OR gate circuit. The OR circuit is adapted to clamp the trigger input of a retriggerable monostable multivibrator to ground during presence of a pulse output from any of the pulse forming circuits. The duration of a triggered output state of the multivibrator is chosen to be greater than the period of alternation of the phase voltages. A construction may be provided in which the pulse forming circuits and the input channels of the OR gate network are formed of opto-isolator units to achieve electrical isolation of the input and the output stages.

5 Claims, 3 Drawing Figures

MISSING PHASE DETECTION CIRCUIT FOR USE WITH THREE-PHASE POWER SOURCES

CROSS-REFERENCE TO RELATED APPLICATIONS

None.

BACKGROUND OF THE INVENTION

1. Field of the Invention:

The present invention relates to circuits for monitoring a three-phase A.C. power source in order to detect a missing phase voltage, or certain other malfunction conditions. It is of special utility where the three-phase source provides power for electronic circuits operating in a digital mode of control, and in these applications can turn the electronic circuits off (to prevent damage thereto) with response times of the order to milliseconds, and can provide automatic recovery of circuit operation from non-permanent malfunctions also with response times of the order of milliseconds.

2. Description of the Prior Art

The requirements placed upon the power supply and power supply monitoring equipment for military aircraft have become increasingly stringent under the trend toward more and larger electronic and electromechanical systems aboard the aircraft. The needs of the power supply have been met by constant speed drive alternator equipment which has provided a source of high power 400 cycle, three-phase, A.C. power aboard such aircraft. However, there has been a continuing effort to satisfy certain requirements for monitoring such power sources which are a consequence of these and other technological trends. For example, along with the development of the aircraft high power A.C. power sources, there has been the development of high power A.C. to D.C. semiconductor converters which use semiconductor components having relatively short thermal time constants, which components can therefore become overstressed in periods as short as milliseconds. There has also been continuing interest in the improvement of monitoring equipment of the type which turns off equipment subject to damage, to give such equipment the further capability of automatic recovery in order that the various complex systems required for military aircraft be available in times of combat should the systems be interrupter by transistory or non-permanent malfunction indications.

In addition to the above-mentioned interests and needs, there is a continuing need to provide power source monitoring circuits which are of lighter weight, and are manufacturable with improved ease of reproducibility.

The use in monitoring circuits for the detection of missing phase conditions of sense channels employing rectification is known. One example is U.S. Pat. No. 3,001,100 entitled "Undervoltage Sensing Circuit" and which has the same assignee as hereunder; and another is U.S. Pat. No. 3,758,826 entitled "Photoelectronic Safety Device" to G. Zizola. Both of these circuits employ the principle of rectification and subsequent filtering of the rectified signal. A disadvantage of this mode of operation is that the time response to the device then becomes limited by the filtering, so that the time response is always long relative to the period of the phase signal. Also, while these devices do have a missing phase detection capability, this capability depends upon a calibration adjustment, thereby causing additional work in the manufacturing and maintenance of the device. Further, the filter structure involves use of a relatively heavy and bulky capacitor.

Another prior art patent of interest is U.S. Pat. No. 3,136,920 entitled "Power Failure Indicator" to R. C. Jensen. This patent uses the threshold of operation of neon glow tubes to sense reduced voltage conditions. An inherent result of the Jensen's structure is the provision of optoisolation of the input stage and output stage of a monitoring circuit for detecting a power source malfunction.

SUMMARY OF THE INVENTION

The input of the missing phase detection circuit comprises three pulse forming networks, which respectively receive as inputs the three individual phase voltages of the three-phase A.C. power source to be monitored. Each pulse forming network includes the light emitting diode element of an opto-isolator consisting of a light emitting diode and a photo-transistor. The light emitting diode acts as a diode limiter, and more particularly a hard limiter circuit. During periods in the cycle of alternation of the respective phase voltages when they are of a polarity causing diode forward conduction, the light signal produced by the corresponding diode is coupled to the base of the associated photo-transistor element. The photo-transistor elements of the three opto-isolator units are each connected between a potential source representing a logical HIGH output state and signal ground, and the three units are in parallel relationship to one another. This gating arrangement constitutes an OR gate for providing a logical LOW output state during the periods in which a light signal impinges on the base of any of the photo-transistors, and for providing a logical HIGH output state only during those times in which there is no input at any one of the photo-transistors. Since the phase voltages are displaced by 120°, and since each of phase voltages will be of the polarity which provides an output of light from the corresponding light emitting diode for 180° of its cycle of alternation, the OR gate will continuously provide a logical LOW output state when all three phases are present. The output of the OR gate is connected to the trigger signal input of retriggerable monostable multivibrator. The multivibrator remains at rest with its output in a LOW logical state as long as all phases are present and the output of the OR gate is therefore in its LOW state. The application of a HIGH logical state pulse signal to the trigger signal input of the multivibrator causes the multi-vibrator output to change to a logical HIGH output stage and remain at said HIGH state for a predetermined period, after which the multivibrator will (in the absence of another intervening HIGH state trigger pulse) revert to its low state. The multivibrator has its internal timing so chosen that the predetermined period over which its output remains in a HIGH state is greater than the period of alternation of the phase voltages. If another HIGH state pulse signal is applied to the trigger signal input of the multivibrator prior to expiration of a HIGH output state, this causes the multivibrator to be retriggered so that the multivibrator's output will not revert to a LOW state until expiration of a renewed predetermined period following the retriggering pulse. In the event a phase is missing a periodic pulsed logical HIGH state will appear at the output of the OR gate, at a pulse repetition frequency equal to the phase voltage frequency. This will cause the multivibrator to continuously provide a logical HIGH output state. In the event the missing phase returns, the pulse output from the OR gate will disappear, and the multivibrator output will automatically return to its logical LOW state.

DESCRIPTION OF THE PREFERRED EMBODIMENT

Figure 1:
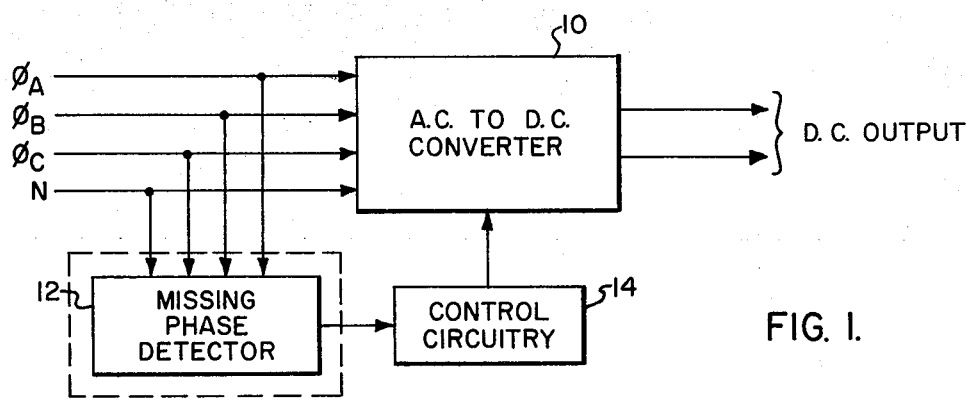
FIG. 1 is a block diagram illustrating the use of a missing phase detector, which is made in accordance with the present invention for the protection of equipment in connection with an A.C. to D.C. converter operating off a three-phase A.C. power line.

Referring now to the drawing and in particular to FIG. 1, a power line consists of phase voltage wires $\phi_A$, $\phi_B$, $\phi_C$, and a neutral wire N. This power line applies the output of a three-phase, alternating current (A.C.) power source to the input of an A.C. to D.C. converter 10. Taps taken from wires $\phi_A$, $\phi_B$, $\phi_C$, and N are also applied as inputs to a missing phase detector 12, which is the subject of the present invention. Missing phase detector 12 provides a digital output. A logical LOW output state of detector 12 represents the condition of presence of all phase voltages on the line. A HIGH output state represents the condition of a phase voltage being missing, or the existence of certain other malfunction conditions of the power supply line. A HIGH output state from detector 12 actuates control circuitry 14 to switch converter 10 off, and thereby protect the converter and the power source from damage due to stress conditions caused by operation with a missing phase. For illustrative purposes, the power supply line shall be considered to carry a 400 cycle, 115 volt, three-phase power signal. Although the application of detector 12 is described with reference to the protection of an A.C. to D.C. converter, it will be appreciated that it may be applied to the protection of other forms of electronic or electrical equipment (including motors) just as well.

Figure 2:
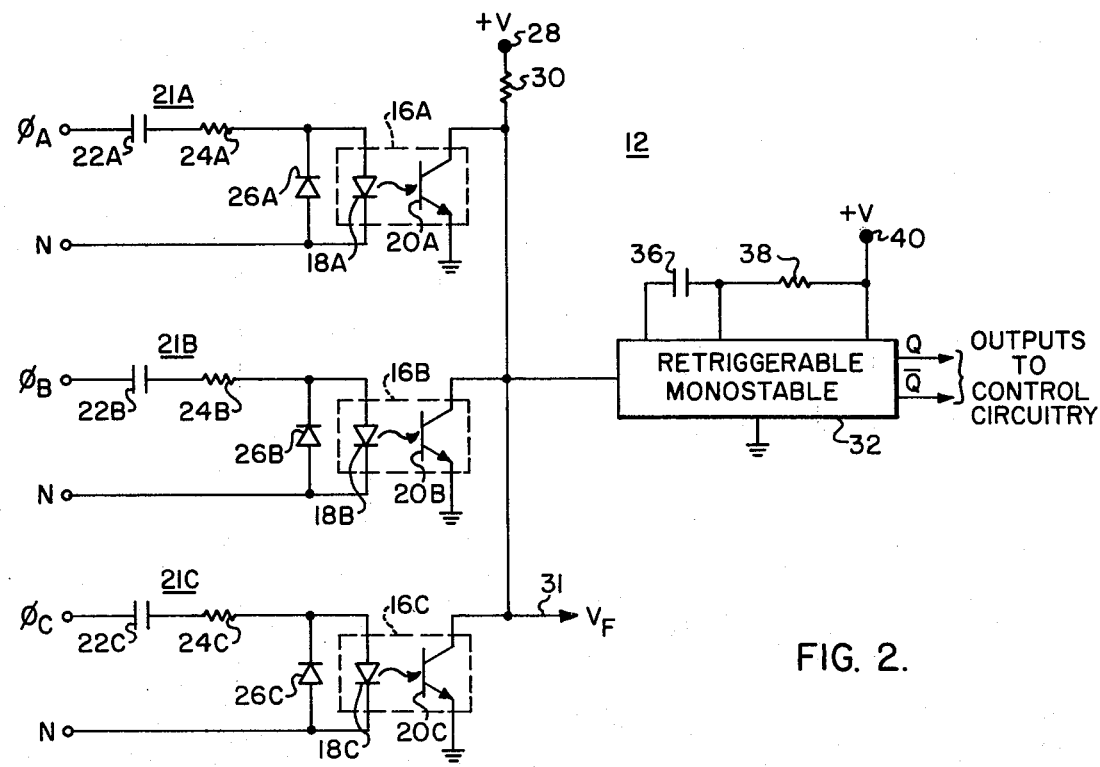
FIG. 2 is an electrical schematic of the missing phase detector of FIG. 1.

Reference is now made to FIG. 2 for a detailed description of missing phase detector circuit 12. Three opto-isolator units 16A, B, C are central elements in the circuit operations. These are conventional, commercially available products each consisting of a light emitting diode element 18 and a photo-transistor element 20. Units 16 are constructed as sealed assemblies in which the light produced by the light emitting diode element strikes the base of the photo-transistor. When the light energy impinges on the base of the photo-transistor, the emitter to collector path of the photo-transistor becomes essentially a closed switch path of conduction. An example of a suitable commercially available opto-isolator is style number MCT4 manufactured by the Electronics Division of Monsanto Commercial Products Co. of Palo Alto, California.

The taps from the individual wires of the power supply line are applied to three sense channels 21A, B, C. All of these channels are alike and therefore the description of channel 21A will be understood to apply to the others. In channel 21A the voltage from phase voltage wire $\phi_A$, is applied across an R-C voltage dropping network consisting of capacitor 22A and resistor 24A, which together are series connected with light emitting diode 18A. The R-C voltage dividing network operates to cut the applied voltage from 115 volts to approximately 3 volts. When light emitting diode 18A has a small positive voltage drop across it, it acts in the fashion of a hard limiting diode limiter, drawing a current limited by the value of resistor 24A and capacitor 22A. A diode 26A is connected in parallel with light emitting diode 18A, but with the direction of forward drop of diode 26A opposite to that of light emitting diode 18A. Diode 26A protects the light emitting diode from excessive reverse voltage.

A direct current (D.C.) source 28 of transistor operating potential, which for illustrative purposes is assumed to provide +5 volts, has a current limiter resistor 30 in series therewith. The photo-transistor elements 20A, B, C are connected in parallel with one another between limiting resistor 30 and ground. During periods in which light is impinging upon the base of photo-transistors, they act as clamping switches with a negligible voltage drop thereacross, to clamp the end of resistor 30 to ground. As will be better understood as the description proceeds, the voltage source 28 is chosen to represent a logical HIGH signal state for the operation of the subsequent digital stage of the circuit. The signal $V_F$, present at the point of common connection of the photo-transistor collectors and resistor 30, is a fault signal indicative whether there is normal presence of all phase voltages along the three-phase supply line, or whether a phase voltage is absent or other of certain fault conditions exist. Voltage source 28 must be either from a power source other than from the power source being monitored or from a supply derived from the 3$\phi$ monitored power source which is present if any one of the phases is present. A tap line 31 at the common circuit of the photo-transistor collectors and resistor 30 provides a test point.

Fault signal $V_F$ is applied to the trigger signal input of a conventional retriggerable monostable multivibrator 32. As long as fault signal $V_F$ is in its LOW state (zero volts or ground) the output of the multivibrator will be at its normal resting, or LOW output state. Upon fault signal $V_F$ changing to its 5 volt state, multivibrator 32 is triggered to produce a logical HIGH state at its output. In the conventional manner of monostable multivibrators, there are within the internal structure of the circuit a capacitor 36 and a resistor 38, the values of which define the time period over which the multivibrator remains in the HIGH state. At the expiration of this period the multivibrator returns to its resting state. The values of capacitance 36 and resistance 38 are so chosen to cause the period which multivibrator 32 is in its HIGH state following triggering to be greater than the period of alternation of the phase voltages. For the case of 400 cycle phase voltage, this time duration is greater than 2.4 milliseconds. In the conventional manner of a retriggerable monostable multivibrator the appearance of a successive pulse prior to the termination of a HIGH output state causes the multivibrator to be retriggered, so that the output state will persist for a renewed predetermined period. The application to the trigger signal input of a periodic trigger with a periodicity less than the period the multivibrator will cause the output to continuously remain in its HIGH state. The D.C. voltage source 40 providing the operating potential for multivibrator 32 must be a voltage derived in the same manner as voltage source 28 and may even be that voltage source. Retriggerable monostable multivibrators are commercially available in the form of integrated circuits (I.C.). An example of a suitable I.C. multivibrator of this type is style number 9601 of the Semiconductor Division of Fairchild Camera and Instrumentation Corp., Mountain View, California.

Figure 3:
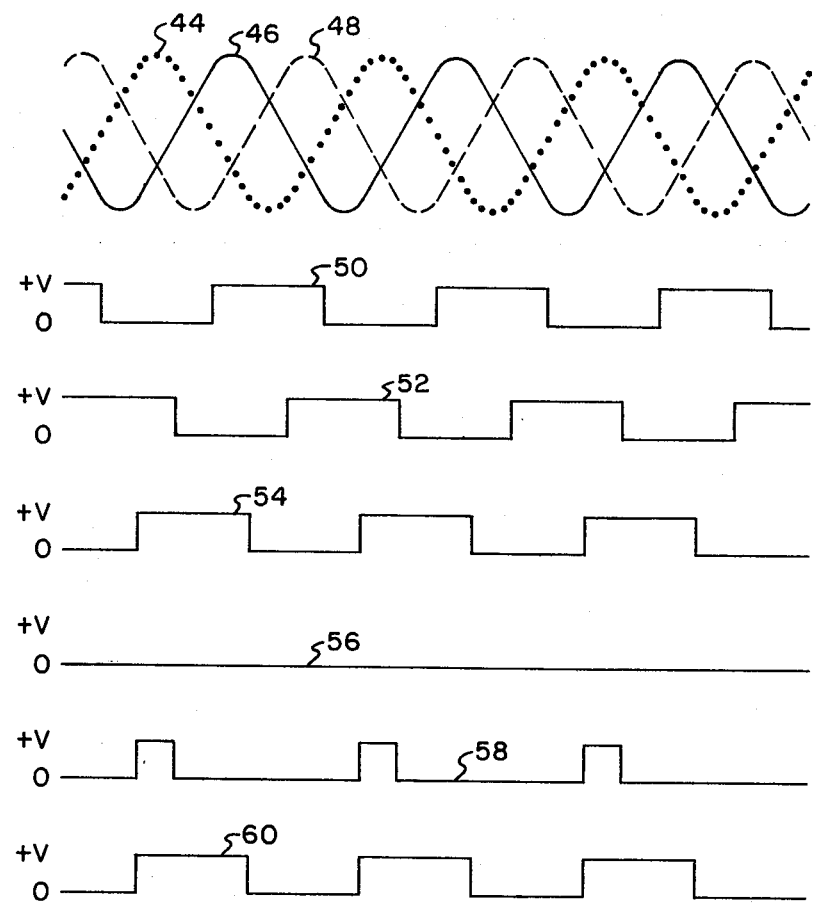
FIG. 3 shows a family of waveforms descriptive of the operation of the missing phase detector of FIG. 2.

The operation of missing phase detector circuit 12 will now be described with reference to the waveforms shown in FIG. 3, wherein: waveform 44 (dotted line) represents the voltage along phase voltage wire $\phi_A$; waveform 46 (solid line) is that along wire $\phi_B$; waveform 48 (broken line) is that along wire $\phi_C$; waveform 50 is that of the output of photo-transistor 20A under the hypothetical condition of only phase voltage $\phi_A$ being applied; waveform 52 represents the output of photo-transistor 20B under the hypothetical conditions of only phase voltage $\phi_B$ being applied; waveform 54 represents the output of photo-transistor 20C under the hypothetical condition of only phase voltage $\phi_C$ being applied; waveform 56 represents the fault signal $V_F$ for a normal three-phase power supply operation in which phase voltages $\phi_A$, $\phi_B$, $\phi_C$ are all present; waveform 58 represents fault signal $V_F$ for the condition of phase voltage $\phi_A$ being absent; and waveform 60 represents fault signal $V_F$ for the condition of phase voltage $\phi_A$ and $\phi_B$ being absent.

If all phase voltages are present, the photo-transistor elements and all of the sense channels 21 will provide clamping of fault signal $V_F$ to ground, due to staggered and overlapping relationship of positive polarity portions of the individual phase voltages, waveforms 44, 46, 48, at the inputs of channels 21A, 21B and 21C. The three photo-transistors 20A, 20B, 20C operate as a gating means causing the fault signal $V_F$ to be continuously clamped to ground, waveform 56. This in turn allows multivibrator 32 to remain in its logical LOW output state. It will be appreciated that transistors 20A, 20B, and 20C constitute an OR gate configuration.

Assume then that the phase voltage on wire $\phi_A$ becomes absent. Under these circumstances the OR gate configuration of the light emitting diodes produces the pulsed waveform 58 having a pulse frequency equal to that of the phase voltages. Waveform 58 triggers multivibrator 32 to a logical HIGH output state, and before the duration of the HIGH output state may terminate it is repetitively retriggered by successive pulses of the pulse train of waveform 58 causing a continuous HIGH output state to appear. This in turn actuates circuitry 14, FIG. 1 to turn OFF converter 10, FIG. 1. Should the missing phase return, the output of the multivibrator 32 will no longer be retriggered. Instead, the output at the termination of the last triggered period of multivibrator 30 will revert to a LOW output state upon expiration of the predetermined period defined by the values of capacitance 36 and resistance 38. The LOW output state in turn actuates to control circuitry 14, FIG. 1, to turn ON converter 10.

It will be appreciated that a wiring mistake which would place the same phase voltage upon two of the wires of the power supply line would yield the same results as an absent phase voltage.

Assume that the phase voltages on both wires $\phi_A$ and $\phi_B$ become absent. The operation of the OR gate configuration will produce the waveform 60, which again will produce continuous retriggering of the output of multivibrator 32 to a continuous HIGH output state.

Among the advantages afforded by the present invention are:

1. Fast response time to any loss of a phase voltage of the three-phase supply.

2. Automatic recovery in the event of return of a missing phase voltage, with a fast response time of recovery.

3. Elimination of the needs of circuit calibration in order to detect a missing phase voltage condition.

4. Complete compatibility with digitally controlled circuitry.

5. Substantially complete electrical isolation of the output stage from the input stage.

6. Low power consumption, as the result of use of the capacity and resistor voltage drop network in each sense channel.

7. Elimination of the requirement for larger (and consequently heavier and bulkier) capacitance elements as the result of the elimination of the requirement for a filter.

I claim as my invention:

1. Apparatus for monitoring a poly-phase power supply of the type providing a predetermined series of phase voltages of a common frequency, each phase voltage of the series comprising a bipolar alternating voltage, said apparatus comprising:
   a. a corresponding series of pulse forming means operatively responsive to said series of phase voltages, respectively, to provide pulsed signals during the excursion of the respective phase voltage waveform in a predetermined one of the power supply polarities;
   b. gating means having a corresponding series of inputs for receiving the outputs of said series of pulse forming means, said gating means being operative to produce a first logical output state except during the receipt of the pulsed signal at any of its inputs; and
   c. a retriggerable monostable multivibrator having its trigger signal input connected to the output of said gating means, said multivibrator being operative in response to the application of a first logical signal state to its trigger signal input to produce a first logical signal state at its output for a predetermined duration of time greater than the full period of alternation of the individual phase signals to detect the absence of said phase voltages, said multivibrator being retriggerable to renew said predetermined duration of said first logical signal state in response to successive applications of a first logical signal state to its trigger input prior to termination of the first state.

2. Apparatus in accordance with claim 1, wherein:
   a. said gating means comprises a source of potential representing said first logical state applied to the trigger signal input of said retriggerable monostable multivibrator, said gating means having its series of inputs operatively connected to a corresponding series of switch devices, each switch device of said series being operative to clamp said trigger signal input to ground during the receipt of the pulsed signal at the corresponding input.

3. Apparatus in accordance with claim 1, wherein:
   a. said pulse forming means of the series of pulse forming means each includes an electric signal-to-light signal conversion device;
   b. said inputs of the gating means each includes a light signal-to-electric signal conversion device; and
   c. the light signals produced by the electrical signal-to-light signal conversion devices of the series of pulse forming means being coupled to the light signal-to-electric signal conversion device of the corresponding inputs of the gating means.

4. Apparatus in accordance with claim 3, wherein:
a. each light signal-to-electric signal conversion device is a photo-transistor operative to provide a high conduction collector-to-emitter path in response to impingement of a light signal upon its base;

b. a source of potential representing said first logical signal state is applied to the trigger signal input of said retriggerable monostable multivibrator; and
c. the collector-to-emitter paths of the photo-transistors being connected between the trigger signal input of said multivibrator and signal ground in parallel relationship to one another.

5. Apparatus in accordance with claim 1, wherein:
a. said gating means comprises an OR gate circuit.

* * * * *